(12) United States Patent
Harada et al.

(10) Patent No.: US 7,378,218 B2
(45) Date of Patent: May 27, 2008

(54) POLYMER, RESIST COMPOSITION AND PATTERNING PROCESS

(75) Inventors: Yuji Harada, Joetsu (JP); Jun Hatakeyama, Joetsu (JP); Yoshio Kawai, Joetsu (JP); Masaru Sasago, Hirakata (JP); Masayuki Endo, Izumi (JP); Kazuhiko Maeda, Tokyo (JP); Haruhiko Komoriya, Kawagoe (JP); Michitaka Ootani, Kawagoe (JP)

(73) Assignees: Shin-Etsu Chemical Co., Ltd., Tokyo (JP); Matsushita Electric Industrial Co., Ltd., Osaka (JP); Central Glass Co., Ltd., Ube-Shi (JP)

( * ) Notice: Subject to any disclaimer, the term of this patent is extended or adjusted under 35 U.S.C. 154(b) by 290 days.

(21) Appl. No.: 11/345,325

(22) Filed: Feb. 2, 2006

(65) Prior Publication Data

US 2006/0177765 A1   Aug. 10, 2006

(30) Foreign Application Priority Data

Feb. 4, 2005   (JP)   ............................. 2005-028618

(51) Int. Cl.
G03F 7/004   (2006.01)
G03F 7/32   (2006.01)

(52) U.S. Cl. ................... 430/270.1; 430/326; 430/330; 430/905; 430/910

(58) Field of Classification Search ............. 430/270.1, 430/326, 330, 905, 910
See application file for complete search history.

(56) References Cited

U.S. PATENT DOCUMENTS

| | | | |
|---|---|---|---|
| 4,491,628 A | 1/1985 | Ito et al. ..................... 430/176 |
| 5,310,619 A | 5/1994 | Crivello et al. .......... 430/270.1 |
| 2005/0084796 A1* | 4/2005 | Hatakeyama et al. .... 430/270.1 |
| 2006/0147836 A1* | 7/2006 | Hatakeyama et al. .... 430/270.1 |

FOREIGN PATENT DOCUMENTS

| | | |
|---|---|---|
| JP | 63-27829 A | 2/1988 |
| JP | 2-27660 B2 | 6/1990 |
| JP | 9-73173 A | 3/1997 |
| JP | 9-90637 A | 4/1997 |
| JP | 9-230595 A | 9/1997 |
| JP | 10-10739 A | 1/1998 |
| JP | 2000-26446 A | 1/2000 |
| JP | 2000-159758 A | 6/2000 |
| WO | WO-97/33198 A1 | 9/1997 |

OTHER PUBLICATIONS

Kishimura et al., Proceedings of SPIE, 2004, pp. 44-55, vol. 5376.
Owa et al., Proceedings of SPIE, 2003, pp. 724-733, vol. 5040.
Azuma et al., Proceedings of SPIE, 2000, pp. 264-269, vol. 3999.
Hatakeyama et al., Proceedings of SPIE, 2003, pp. 672-681, vol. 5039.
Ito et al., Proceedings of SPIE, 2001, pp. 273-284, vol. 4345.

* cited by examiner

Primary Examiner—John S. Chu
(74) Attorney, Agent, or Firm—Birch, Stewart, Kolasch & Birch, LLP

(57) ABSTRACT

A fluorinated polymer comprising recurring units of formulae (1a) to (1d) and having a Mw of 1,000-500,000 is provided. $R^1$ is an acid labile group, $R^2$ is a single bond or methylene, a1, a2, a3, and a4 are numbers from more than 0 to less than 1, and $0 < a1+a2+a3+a4 \leq 1$, b is 1 or 2, and c is 0 or 1. A resist composition comprising the polymer, when processed by the lithography involving ArF exposure, has many advantages including resolution, line edge roughness, etch resistance

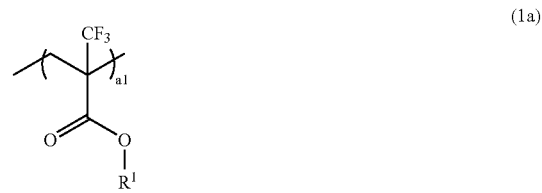

(1a)

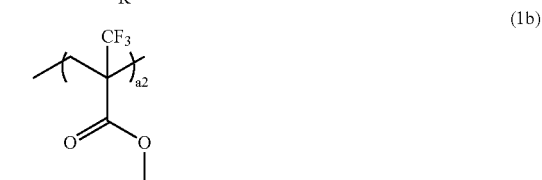

(1b)

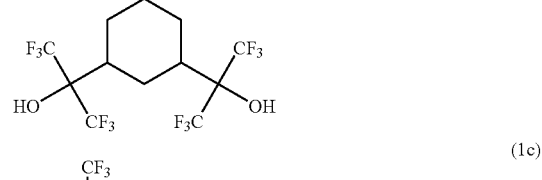

(1c)

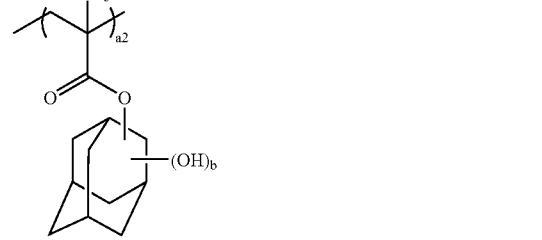

(1d)

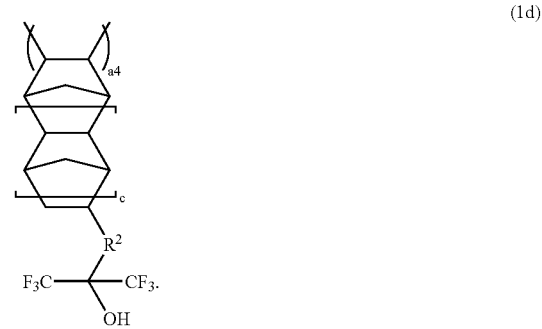

7 Claims, No Drawings

US 7,378,218 B2

POLYMER, RESIST COMPOSITION AND PATTERNING PROCESS

CROSS-REFERENCE TO RELATED APPLICATION

This non-provisional application claims priority under 35 U.S.C. §119(a) on Patent Application No. 2005-028618 filed in Japan on Feb. 4, 2005, the entire contents of which are hereby incorporated by reference.

TECHNICAL FIELD

This invention relates to resist compositions, especially chemically amplified positive resist compositions for the lithographic micropatterning technology. It also relates to polymers useful as a base resin in such resist compositions, and a patterning process.

BACKGROUND ART

In the recent drive for higher integration and operating speeds in LSI devices, the pattern rule is made drastically finer. The rapid advance toward finer pattern rules is grounded on the development of a light source of a shorter wavelength, a projection lens with an increased numerical aperture (NA), and a resist material with improved performance.

With respect to the light source for exposure, the changeover from i-line (365 nm) to shorter wavelength KrF laser (248 nm) enabled mass-scale production of DRAM with an integration degree of 64 MB (processing feature size≦0.25 µm). To establish the micropatterning technology (processing feature size≦0.2 µm) necessary for the fabrication of DRAM with an integration degree of 256 MB and 1 GB or more, the lithography using ArF excimer laser (193 nm) is under active investigation. Although $F_2$ laser (157 nm) is also considered as one candidate light source of shorter wavelength, the use of $F_2$ laser is postponed because of many outstanding problems including a more expensive scanner.

With respect to the increase of NA, not only an improvement in lens performance is sought for, but also the immersion lithography which can establish an NA of 1.00 or greater by filling a high refractive index liquid between a lens and a wafer is of great interest. See Proc. SPIE, Vol. 5376, p 44 (2004), for example. For the ArF immersion lithography now under investigation, it was proposed to apply to the 45-nm node by filling the space between the lens and the wafer with deionized water having a refractive index of 1.44. See Proc. SPIE, Vol. 5040, p 724 (2003), for example.

With respect to the resist material, since the development of acid-catalyzed chemical amplification positive working resist materials as disclosed in U.S. Pat. No. 4,491,628 and U.S. Pat. No. 5,310,619 (JP-B 2-27660 and JP-A 63-27829), it has become possible to achieve a higher resolution and sensitivity. They now become predominant resist materials adapted for deep UV lithography. Of these, the KrF resist materials enjoyed early use on the 0.3 micron process, passed through the 0.25 micron rule, and currently entered the mass production phase on the 0.18 micron rule. Engineers have started investigation on the 0.15 micron rule. The ArF resist is expected to enable miniaturization of the design rule to 0.13 µm or less.

Various alkali-soluble resins are used as the base resin in such chemically amplified resist compositions. Depending on a light source selected for light exposure, a base resin of different skeleton is used. For KrF resists, a polyhydroxystyrene resin having phenolic hydroxyl groups as the alkali-soluble group is now used a standard base resin.

For ArF resist materials, since polyhydroxystyrene resins and novolac resins have very strong absorption at a wavelength around 193 nm, studies were made on poly(meth)acrylate resins and resins comprising cycloaliphatic olefin such as norbornene as polymerized units, both using carboxyl groups as the alkali-soluble group (see JP-A 9-73173, JP-A 10-10739, JP-A 9-230595 and WO 97/33198). Of these, the poly(meth)acrylate resins are expected to reach a practical level because of ease of polymerization. One of the poly(meth)acrylate resins proposed thus far is a poly(meth)acrylate resin having methyladamantyl groups as the acid labile group and lactone rings as the adhesive group as disclosed in JP-A 9-90637. Norbornyl lactone is also proposed as an adhesive group having enhanced etching resistance as disclosed in JP-A 2000-26446 and JP-A 2000-159758.

The serious problems left unsolved for ArF resist materials are reduction of line edge roughness and enhancement of etching resistance. In general, a higher light contrast leads to a less line edge roughness. For example, increased NA of lens, application of modified illumination or phase shift mask, or wavelength reduction allows the light contrast to be increased, resulting in a reduced line edge roughness. Thus the wavelength reduction from KrF to ArF excimer laser is expected to reduce line edge roughness. However, it is reported that ArF resists actually have greater line edge roughness than KrF resists and that image contrast is in inverse proportion to line edge roughness. This is attributable to the difference in performance between ArF and KrF resists. See Proc. SPIE, Vol. 3999, p 264 (2000), for example.

The use of an alternating copolymer as the base is proposed as one means of minimizing the edge roughness of pattern after development. See Proc. SPIE, Vol. 5039, p 672 (2003), for example. The alternating copolymer having an ordered arrangement of recurring units within the polymer chain is characterized by its ability to minimize edge roughness, as compared with random copolymers and block copolymers.

One candidate of alternating copolymers that can be used as the ArF resist is a copolymer of norbornene and maleic anhydride as described in JP-A 10-10739. However, the resist using this copolymer suffers from storage instability and the like, and it remains unexpectable when this resist will be reduced to commercial practice. Another candidate is a copolymer of norbornene and α-trifluoromethylacrylate, which was the base polymer candidate for $F_2$ resist. See Proc. SPIE, Vol. 4345, p 273 (2001), for example.

SUMMARY OF THE INVENTION

An object of the invention is to provide a novel fluorinated polymer which is used to formulate a resist composition having transparency to laser light having a wavelength of up to 300 nm, especially up to 200 nm, dry etch resistance, and alkali development amenability; a resist composition, especially chemically amplified positive resist composition, comprising the fluorinated polymer as a base resin; and a patterning process using the same.

The inventor has discovered that a fluorinated polymer comprising recurring units of the general formulae (1a) to (1d), shown below, can be prepared by radical polymerization and similar techniques which can be readily implemented on an industrial basis, and that a resin resulting from polymerization is used to formulate a chemically amplified resist composition having transparency at a wavelength of up to 200 nm, etch resistance, alkali development amenability, and minimal line edge roughness.

Embodiments of the present invention include a polymer, a resist composition, a chemically amplified positive resist composition, and a patterning process.

In a first aspect, the invention provides a polymer comprising recurring units having the general formulae (1a) to (1d):

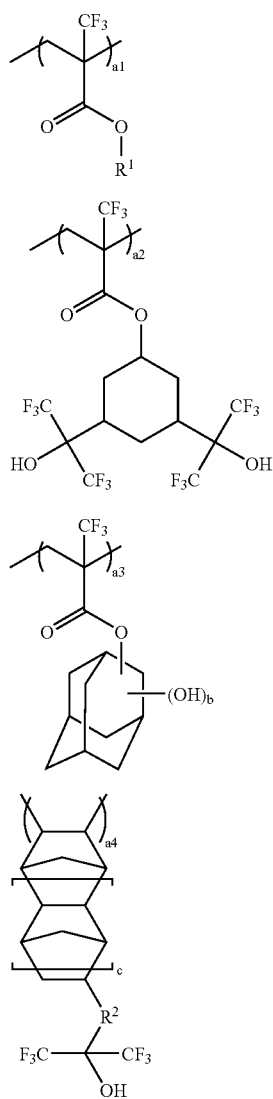

wherein $R^1$ is an acid labile group, $R^2$ is a single bond or methylene group, a1, a2, a3, and a4 are numbers in the range: $0<a1<1$, $0<a2<1$, $0<a3<1$, $0<a4<1$, and $0<a1+a2+a3+a4<1$, b is 1 or 2, and c is 0 or 1, the polymer having a weight average molecular weight of 1,000 to 500,000.

In a second aspect, the invention provides a resist composition comprising the polymer. A preferred embodiment relates to a chemically amplified positive resist composition comprising (A) the polymer, (B) an organic solvent, and (C) a photoacid generator. The resist composition may further comprise (D) a basic compound and/or (E) a dissolution inhibitor.

In a third aspect, the invention provides a process for forming a pattern, comprising the steps of (1) applying the resist composition onto a substrate to form a coating, (2) heat treating the coating and exposing it to high-energy radiation with a wavelength of up to 200 nm through a photomask, and (3) optionally heat treating the exposed coating and developing it with a developer. Typically, the high-energy radiation is of an ArF excimer laser.

BENEFITS OF THE INVENTION

The resist composition comprising the inventive polymer, when processed by the lithography involving ArF exposure, has many advantages including improved resolution, minimal line edge roughness, improved etch resistance, and especially minimal surface roughness after etching. It exhibits similar better performance when processed by the ArF immersion lithography with liquid interposed between the projection lens and the wafer.

DESCRIPTION OF THE PREFERRED EMBODIMENTS

As used herein, the notation $(C_n-C_m)$ means a group containing from n to m carbon atoms per group.

Polymer

The polymer or high molecular weight compound of the invention is defined as comprising recurring units having the general formulae (1a) to (1d).

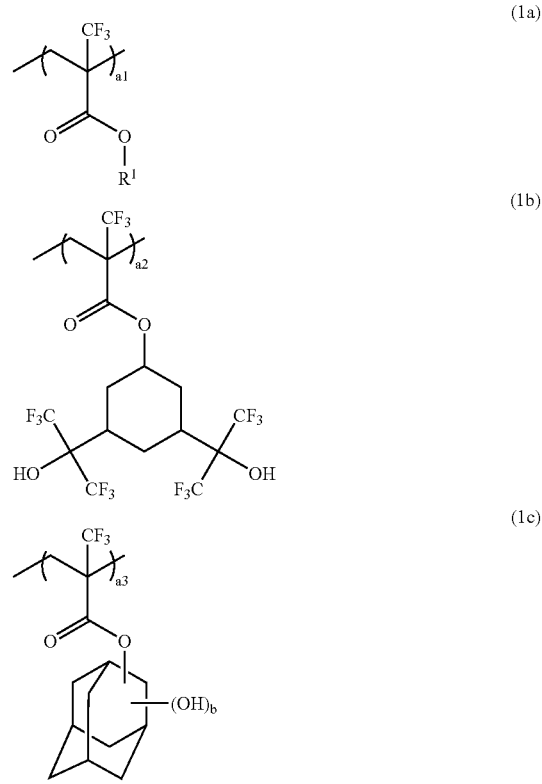

-continued

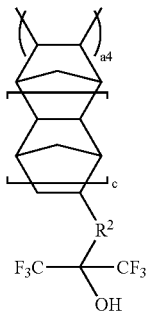
(1d)

Herein R¹ is an acid labile group, R² is a single bond or methylene group, a1, a2, a3, and a4 are numbers in the range: 0<a1<1, 0<a2<1, 0<a3<1, 0<a4<1, and 0<a1+a2+a3+a4≦1, b is 1 or 2, and c is 0 or 1.

In a polymer comprising recurring units a1, a2, a3 and a4, a1+a2+a3+a4=1 means that the total amount of recurring units a1, a2, a3 and a4 is 100 mol % relative to the total amount of overall recurring units; and a1+a2+a3+a4<1 means that the total amount of recurring units a1, a2, a3 and a4 is less than 100 mol % relative to the total amount of overall recurring units, allowing for inclusion of additional recurring units.

R¹ is an acid labile group or a protective group for the hydroxyl group on a fluorinated compound, which is selected from a variety of such groups. Examples of the protective group include groups of the following general formulae (AL-1) to (AL-3), trialkylsilyl groups in which each alkyl moiety has 1 to 6 carbon atoms, and oxoalkyl groups of 4 to 20 carbon atoms.

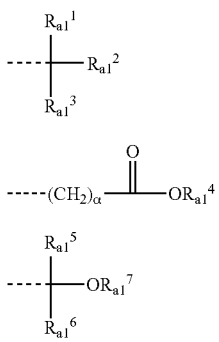

(AL-1)

(AL-2)

(AL-3)

In these formulae and throughout the specification, a broken line denotes a valence bond.

$R_{a1}^{1}$, $R_{a1}^{2}$ and $R_{a1}^{3}$ may be the same or different and stand for straight, branched or cyclic $C_1$-$C_{20}$ hydrocarbon groups, which may contain a hetero atom such as oxygen, sulfur or nitrogen, or bridged cyclic hydrocarbon groups. Alternatively, a pair of $R_{a1}^{1}$ and $R_{a1}^{2}$, $R_{a1}^{1}$ and $R_{a1}^{3}$, and $R_{a1}^{2}$ and $R_{a1}^{3}$, taken together, may form a ring with the carbon atom to which they are bonded. Each of $R_{a1}^{1}$, $R_{a1}^{2}$ and $R_{a1}^{3}$ is a straight or branched $C_1$-$C_{20}$ alkylene group when they form a ring. $R_{a1}^{4}$ and $R_{a1}^{7}$ stand for straight, branched or cyclic $C_1$-$C_{20}$ alkyl groups, which may contain a hetero atom such as oxygen, sulfur, nitrogen or fluorine, such as alkyl groups in which some hydrogen atoms are replaced by hydroxyl, alkoxy, oxo, amino, alkylamino or other groups. $R_{a1}^{5}$ and $R_{a1}^{6}$ stand for hydrogen or straight, branched or cyclic $C_1$-$C_{20}$ alkyl groups, which may contain a hetero atom such as oxygen, sulfur, nitrogen or fluorine. Alternatively, a pair of $R_{a1}^{5}$ and $R_{a1}^{6}$, $R_{a1}^{5}$ and $R_{a1}^{7}$, and $R_{a1}^{6}$ and $R_{a1}^{7}$, taken together, may form a ring with the carbon or carbon and oxygen atoms to which they are bonded. Each of $R_{a1}^{5}$, $R_{a1}^{6}$ and $R_{a1}^{7}$ is a straight or branched $C_1$-$C_{20}$ alkylene group when they form a ring. The subscript α is an integer of 0 to 6.

In formula (AL-1), illustrative examples of $R_{a1}^{1}$, $R_{a1}^{2}$ and $R_{a1}^{3}$ include methyl, ethyl, n-propyl, isopropyl, tert-butyl, cyclohexyl, cyclopentyl, norbornyl, adamantyl, and menthyl. The acid labile groups of formula (AL-1) are exemplified by the substituent groups shown below.

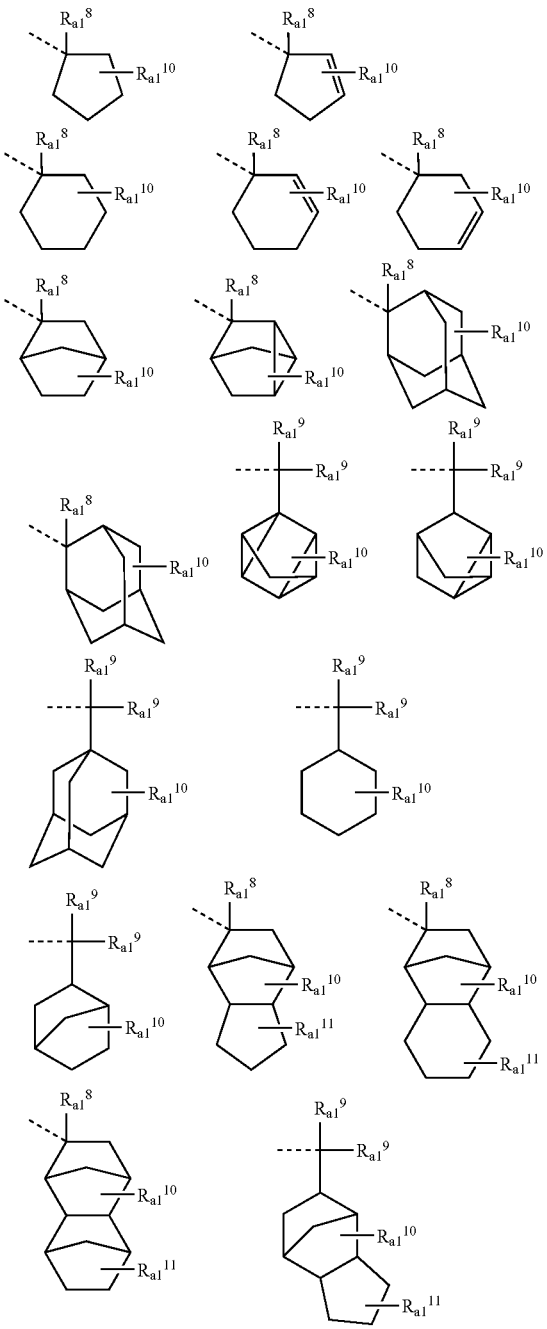

-continued

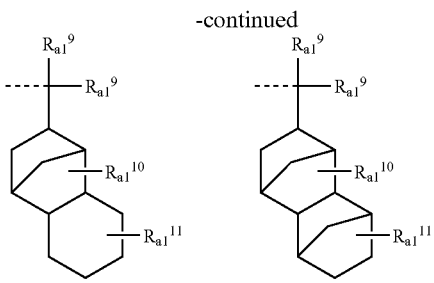

Herein, $R_{a1}^8$ and $R_{a1}^9$ stand for straight, branched or cyclic alkyl groups of 1 to 10 carbon atoms, preferably 1 to 6 carbon atoms. $R_{a1}^{10}$ and $R_{a1}^{11}$ stand for hydrogen or monovalent hydrocarbon groups of 1 to 6 carbon atoms, which may contain a hetero atom and which may be straight, branched or cyclic.

Illustrative examples of $R_{a1}^8$ and $R_{a1}^9$ include methyl, ethyl, propyl, isopropyl, n-butyl, sec-butyl, n-pentyl, n-hexyl, cyclopropyl, cyclopropylmethyl, cyclobutyl, cyclopentyl, and cyclohexyl. Illustrative examples of $R_{a1}^{10}$ and $R_{a1}^{11}$ include methyl, ethyl, n-propyl, isopropyl, n-butyl, sec-butyl, n-pentyl, n-hexyl, hydroxymethyl, hydroxyethyl, methoxy, methoxymethoxy, ethoxy, and tert-butoxy. When $R_{a1}^{10}$ and $R_{a1}^{11}$ contain hetero atoms such as oxygen, sulfur or nitrogen, they may be contained, for example, in the form of —OH, —OR$_{a1}^{12}$, —O—, —S—, —S(=O)—, —NH$_{12}$, —NHR$_{a1}^{12}$, —N(R$_{a1}^2$)$_2$, —NH— or —NR$_{a1}^{12}$— wherein $R_{a1}^{12}$ is a $C_1$-$C_5$ alkyl group. Optionally, a hetero atom may intervene in the alkyl chain.

Illustrative examples of the acid labile groups of formula (AL-2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

In formula (AL-3), examples of the straight, branched or cyclic $C_1$-$C_{20}$ alkyl groups represented by $R_{a1}^5$ and $R_{a1}^6$ include methyl, ethyl, propyl, isopropyl, n-butyl, sec-butyl, tert-butyl, cyclopentyl, cyclohexyl, 2-ethylhexyl, and n-octyl. Examples of suitable hydrocarbon groups represented by $R_{a1}^7$ include substituted alkyl groups as shown below.

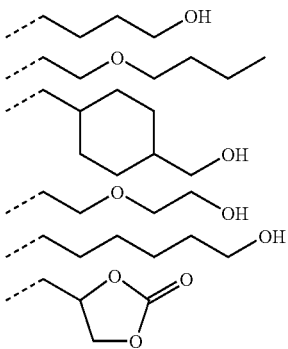

Of the acid labile groups having formula (AL-3), examples of the cyclic groups include tetrahydrofuran-2-yl, 2-methyltetrahydrofuran-2-yl, tetrahydropyran-2-yl, and 2-methyltetrahydropyran-2-yl. Examples of the straight and branched groups are exemplified by the following groups, with ethoxyethyl, butoxyethyl and ethoxypropyl being preferred.

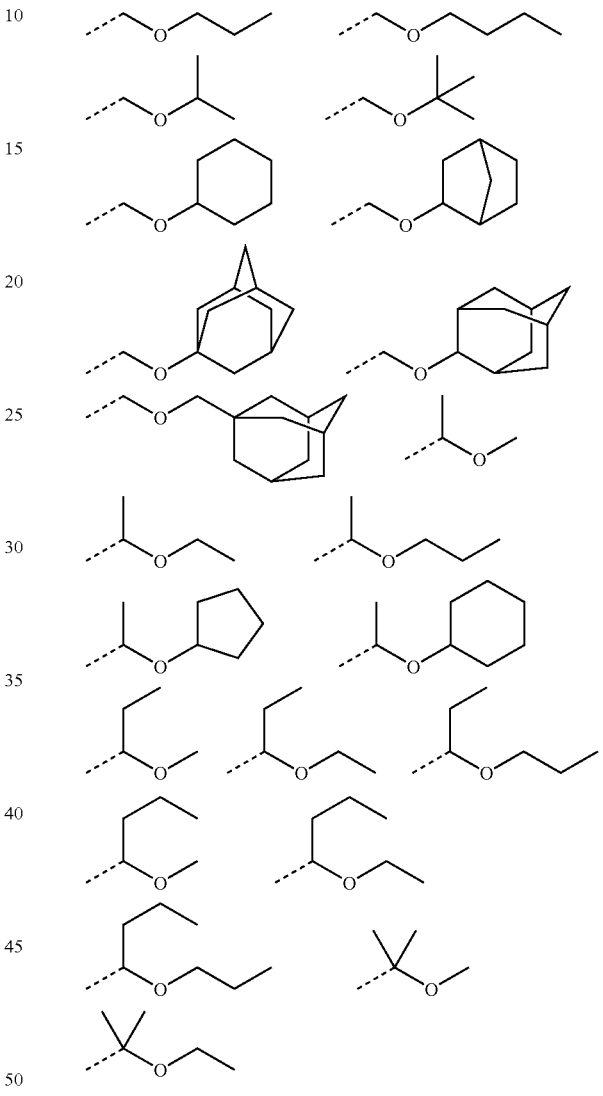

Although the polymer of the invention performs well even when it consists of recurring units of formulae (1a) to (1d), it may further comprise recurring units of one or more of the following general formulae (2a) to (2c) in combination therewith.

(2a)

-continued (2b)
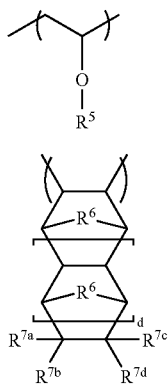

(2c)

Herein $R^3$ is a hydrogen atom, fluorine atom, or $C_1$-$C_4$ alkyl or fluoroalkyl group. Each of $R^4$ and $R^5$ is a hydrogen atom, acid labile group, adhesive group, or straight, branched or cyclic $C_1$-$C_{20}$ alkyl or fluoroalkyl group. $R^6$ is a methylene group, oxygen atom or sulfur atom. Each of $R^{7a}$ to $R^{7d}$ is a hydrogen atom, fluorine atom, straight, branched or cyclic $C_1$-$C_{20}$ alkyl or fluoroalkyl group, or substituent group of the general formula (2d) or (2e), shown below. At least one of $R^{7a}$ to $R^{7d}$ should contain a substituent group of the general formula (2d) or (2e). The subscript d is 0 or 1.

(2d)
(2e)

$R^8$ is a single bond or straight, branched or cyclic $C_1$-$C_{20}$ alkylene or fluoroalkylene group. Each of $R^9$ and $R^{10}$ is a hydrogen atom, acid labile group, adhesive group, or straight, branched or cyclic $C_1$-$C_{20}$ alkyl or fluoroalkyl group.

Examples of the $C_1$-$C_4$ alkyl group represented by $R^3$ include methyl, ethyl, n-propyl, isopropyl, n-butyl, sec-butyl, and tert-butyl. Suitable $C_1$-$C_4$ fluoroalkyl groups include substituted forms of the foregoing alkyl groups in which one or more hydrogen atoms are substituted with fluorine atoms, such as, for example, trifluoromethyl, 2,2,2-trifluoroethyl, 3,3,3-trifluoropropyl, 1,1,1,3,3,3-hexafluoroisopropyl, and 1,1,2,2,3,3,3-heptafluoro-n-propyl.

The acid labile groups represented by $R^4$, $R^5$, $R^9$, and $R^{10}$ are the same as the protective groups described above for $R^1$.

The adhesive groups represented by $R^4$, $R^5$, $R^9$, and $R^{10}$ are selected from a variety of such groups, with those groups of the formulae shown below being preferred.

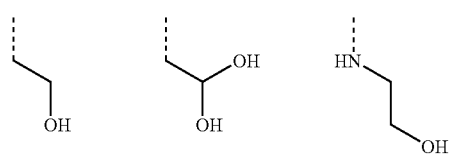

-continued

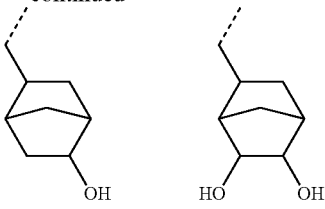

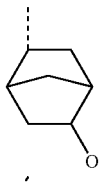
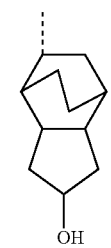

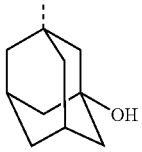
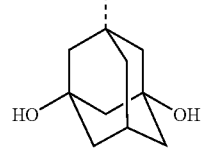

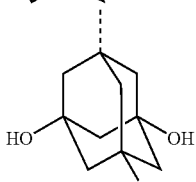
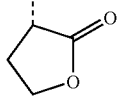

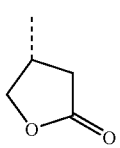
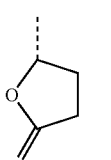

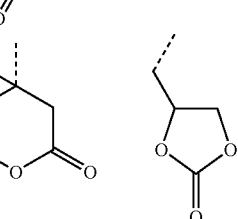

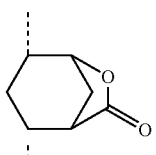
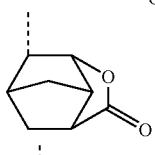

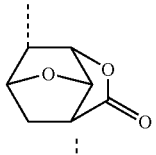
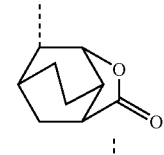

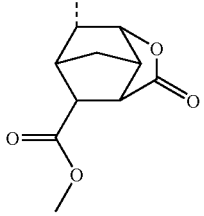
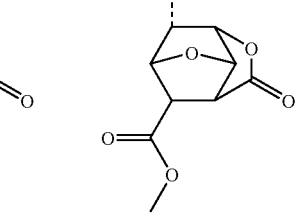

-continued

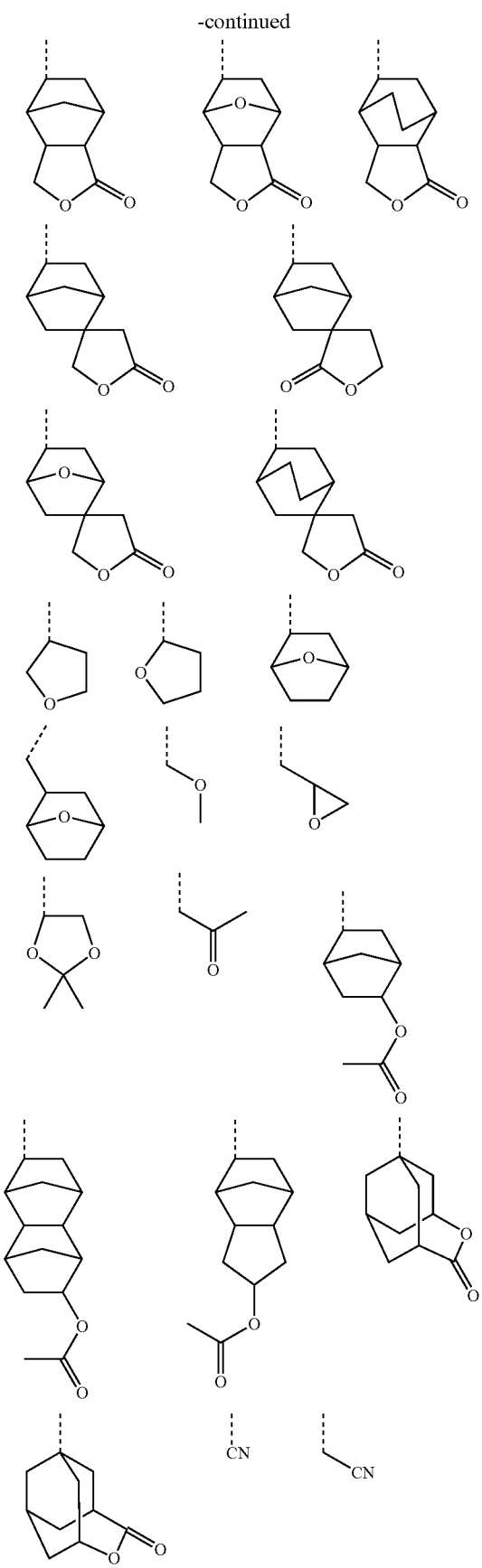

-continued

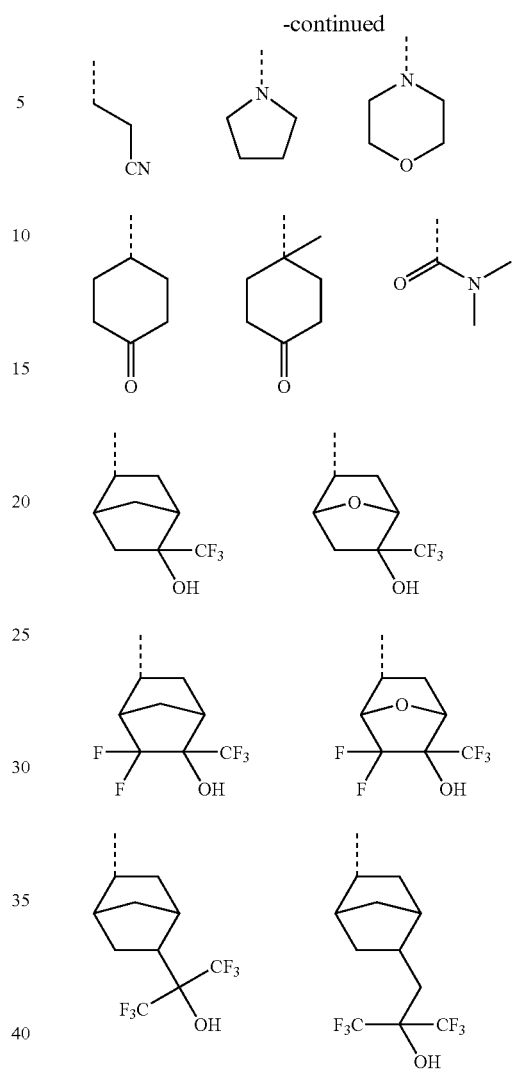

Examples of the straight, branched or cyclic $C_1$-$C_{20}$ alkyl groups represented by $R^4$, $R^5$, $R^{7a}$ to $R^{7d}$, $R^9$, and $R^{10}$ include methyl, ethyl, propyl, isopropyl, n-butyl, sec-butyl, tert-butyl, tert-amyl, n-pentyl, n-hexyl, n-octyl, n-nonyl, n-decyl, cyclopropyl, cyclobutyl, cyclopentyl, cyclohexyl, cyclopentylmethyl, cyclopentylethyl, cyclopentylbutyl, cyclohexylmethyl, cyclohexylethyl, and cyclohexylbutyl. Suitable straight, branched or cyclic $C_1$-$C_{20}$ fluoroalkyl groups include substituted forms of the foregoing alkyl groups in which one or more hydrogen atoms are substituted with fluorine atoms, such as, for example, trifluoromethyl, 2,2,2-trifluoroethyl, 3,3,3-trifluoropropyl, 1,1,1,3,3,3-hexafluoroisopropyl, and 1,1,2,2,3,3,3-heptafluoro-n-propyl.

Suitable straight, branched or cyclic $C_1$-$C_{20}$ alkylene groups represented by $R^8$ are the foregoing alkyl groups with one hydrogen atom being eliminated. Suitable straight, branched or cyclic $C_1$-$C_{20}$ fluoroalkylene groups include substituted forms of the foregoing alkylene groups in which some or all of the hydrogen atoms are substituted with fluorine atoms.

Illustrative, non-limiting examples of the recurring units having formula (2a) are given below.

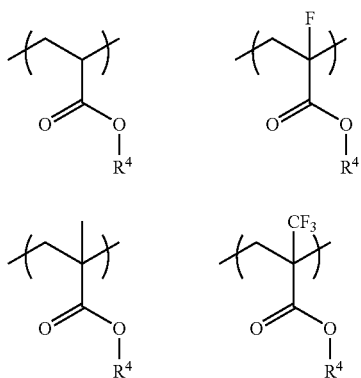

Herein, R⁴ is a hydrogen atom, acid labile group, adhesive group or straight, branched or cyclic $C_1$-$C_{20}$ alkyl or fluoroalkyl group.

Illustrative, non-limiting examples of the recurring units having formula (2c) are given below.

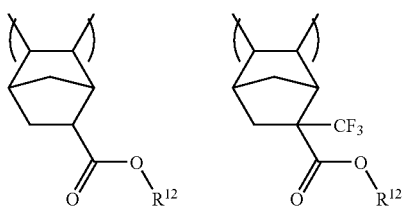

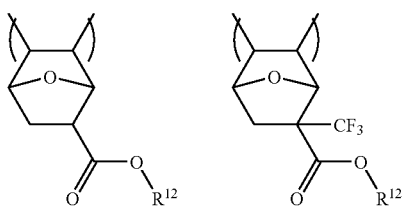

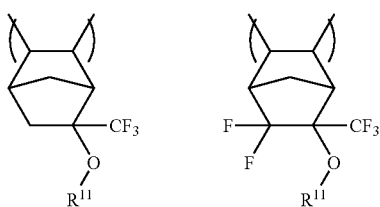

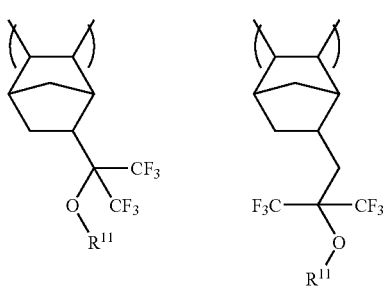

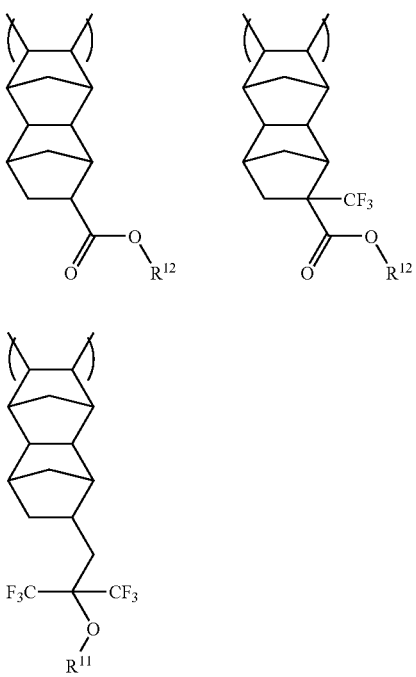

Herein, each of $R^{11}$ and $R^{12}$ is a hydrogen atom, acid labile group, adhesive group or straight, branched or cyclic $C_1$-$C_{20}$ alkyl or fluoroalkyl group, with the acid labile group and adhesive group being as defined above.

In the polymers of the invention comprising recurring units (1a) to (1d) and (2a) to (2c), recurring units (3) of one or more types as shown below may further be incorporated for the purpose of improving the adhesion and/or transparency of the resin.

(3)

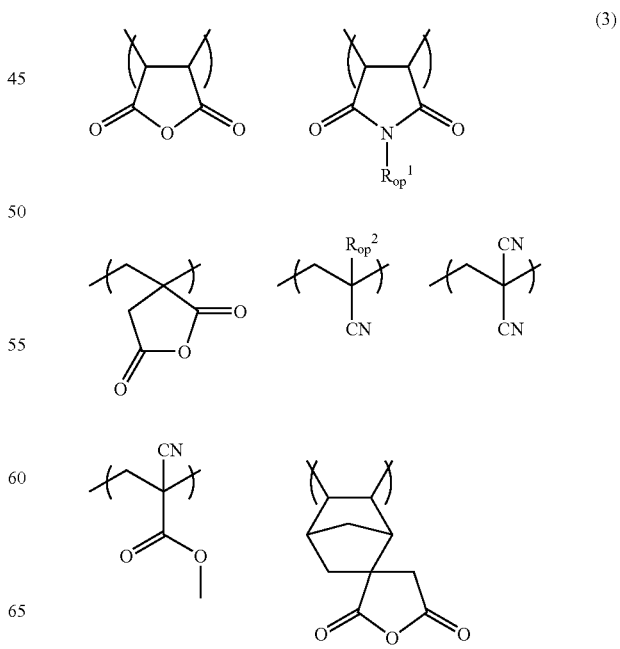

-continued

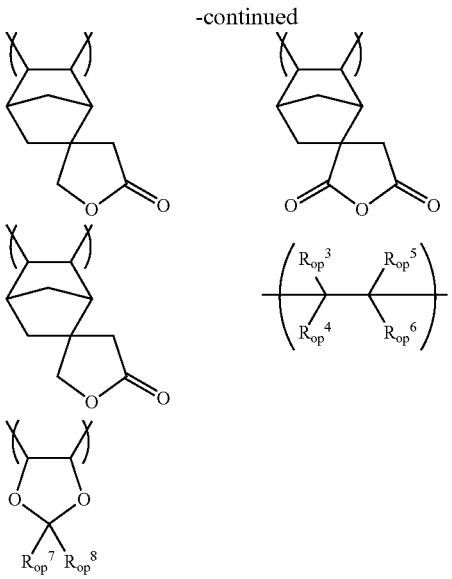

Herein, $R_{op}^1$ and $R_{op}^2$ each are a hydrogen atom or a straight, branched or cyclic $C_1$-$C_{20}$ alkyl or fluoroalkyl group. $R_{op}^3$ to $R_{op}^6$ each are a hydrogen atom, fluorine atom or a $C_1$-$C_4$ fluoroalkyl group, and at least one of $R_{op}^3$ to $R_{op}^6$ contains a fluorine atom(s). $R_{op}^7$ and $R_{op}^8$ each are hydrogen, methyl or trifluoromethyl.

The polymer of the invention is generally synthesized by dissolving monomers corresponding to the units having formula (1a) to (1d) and (2a) to (2c) and monomers corresponding to the adhesion or transparency-improving units (3) in a solvent, adding a catalyst thereto, and effecting polymerization reaction while heating or cooling the system if necessary. The polymerization reaction also depends on the type of initiator or catalyst, trigger means (including light, heat, radiation and plasma), and polymerization conditions (including temperature, pressure, concentration, solvent, and additives). Commonly used for preparation of the polymers of the invention are radical copolymerization of triggering polymerization with radicals of 2,2'-azobisisobutyronitrile (AIBN) or the like and ionic polymerization (anionic polymerization) in the presence of alkyllithium and similar catalysts. These polymerization reactions may be carried out in a conventional manner.

The initiator used for radical polymerization is not critical. Exemplary initiators include azo compounds such as AIBN, 2,2'-azobis(4-methoxy-2,4-dimethylvaleronitrile), 2,2'-azobis(2,4-dimethylvaleronitrile), and 2,2'-azobis(2,4,4-trimethylpentane); and peroxide compounds such as tert-butyl peroxypivalate, lauroyl peroxide, benzoyl peroxide and tert-butyl peroxylaurate. Water-soluble initiators include persulfate salts such as potassium persulfate, and redox combinations of potassium persulfate or peroxides such as hydrogen peroxide with reducing agents such as sodium sulfite. The amount of the polymerization initiator used is determined as appropriate in accordance with such factors as the identity of initiator and polymerization conditions, although the amount is often in the range of about 0.001 to 5% by weight, especially about 0.01 to 2% by weight based on the total weight of monomers to be polymerized.

For the polymerization reaction, a solvent may be used. The polymerization solvent used herein is preferably one which does not interfere with the polymerization reaction. Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran (THF). These solvents may be used alone or in admixture of two or more. Further, any of well-known molecular weight modifiers such as dodecylmercaptan may be used in the polymerization system.

The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under vacuum.

Desirably the polymer has a weight average molecular weight (Mw) of about 1,000 to about 500,000, and especially about 2,000 to about 100,000. Note that the Mw is determined by gel permeation chromatography (GPC) using polystyrene standards.

In the polymers of the invention wherein U1 stands for units having formulae (1a) to (1d), U2 stands for units having formulae (2a) to (2d), and U3 stands for adhesion and transparency-improving units, the molar proportion of U1 through U3, with the proviso that U1+U2+U3=1, is preferably determined so as to meet:

$0<U1\leq 1$, more preferably $0.7\leq U1\leq 1$,
$0\leq U2\leq 0.4$, more preferably $0\leq U2\leq 0.2$, and
$0\leq U3\leq 0.3$, more preferably $0\leq U3\leq 0.1$.

With respect to the units of formulae (1a) to (1d), the subscripts a1, a2, a3, and a4 are numbers in the range: $0<a1<1$, $0<a2<1$, $0<a3<1$, $0<a4<1$, and $0<a1+a2+a3+a4\leq 1$, and preferably in the range:

$0<a1/a\leq 0.6$, more preferably $0.2\leq a1/a\leq 0.5$,
$0<a2/a\leq 0.4$, more preferably $0<a2/a\leq 0.3$,
$0<a3/a\leq 0.4$, more preferably $0<a3/a\leq 0.3$, and
$0<a4/a\leq 0.5$, more preferably $0.2\leq a4/a\leq 0.5$, provided $a1+a2+a3+a4=a$.

The polymer of the invention can be used as a base resin in resist compositions, typically chemically amplified resist compositions, and more typically chemically amplified positive working resist compositions and as a base resin for resist protecting film. It is understood that the polymer of the invention may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Resist Composition

As long as the polymer of the invention is used as a base resin, the resist composition of the invention may be prepared using well-known components. In a preferred embodiment, the chemically amplified positive resist composition comprises (A) the above-defined polymer as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin (inventive polymer), photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, propylene glycol monoethyl ether, propylene glycol dimethyl ether, ethylene glycol monomethyl ether, ethylene glycol monoethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate (PGMEA) which is safe, and mixtures thereof.

The solvent is preferably used in an amount of about 300 to 10,000 parts by weight, more preferably about 500 to 5,000 parts by weight per 100 parts by weight of the base resin.

Component (C)

The photoacid generators used herein include
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium Salts of Formula (P1a-1), (P1a-2) or (P1b):

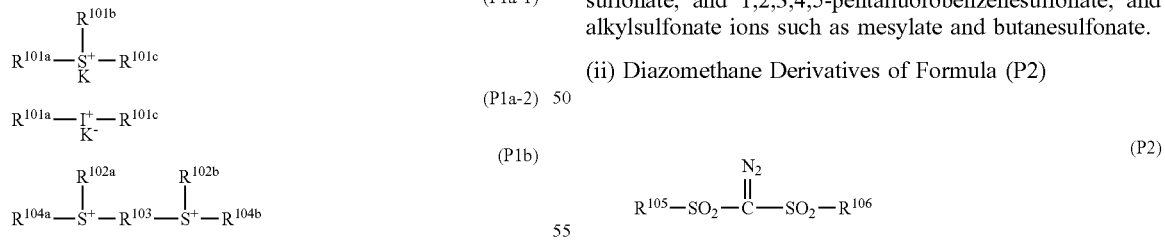

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ are alkylene groups of 1 to 6 carbon atoms when they form a ring. $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl.

Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

(ii) Diazomethane Derivatives of Formula (P2)

$$R^{105}-SO_2-\overset{\overset{N_2}{\|}}{C}-SO_2-R^{106} \quad (P2)$$

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl;

alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

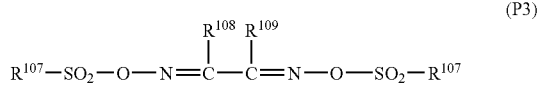

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

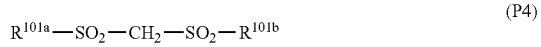

Herein, $R^{101a}$ and $R^{101b}$ are independently straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Examples of $R^{101a}$ and $R^{101b}$ are as described above for the onium salts (i).

(v) Sulfonic Acid Esters of N-hydroxyimide Compounds of Formula (P5)

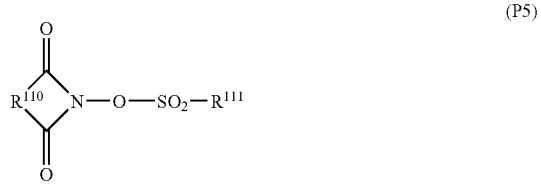

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generators (i) to (ix) include:

onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate, cyclohexylmethyl(2-oxocyclohexyl)sulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;
β-ketosulfone derivatives such as
2-cyclohexylcarbonyl-2-(p-toluenesulfonyl)propane and
2-isopropylcarbonyl-2-(p-toluenesulfonyl)propane;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethanesulfonate, and
N-hydroxy-5-norbornene-2,3-dicarboxyimide p-toluenesulfonate.

Preferred among these acid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocylohexyl)sulfonium trifluoromethanesulfonate, and
1,2'-naphthylcarbonylmethyltetrahydrothiophenium triflate;

diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;

glyoxime derivatives such as
bis-O-(p-toluenesulfonyl)-α-dimethylglyoxime and
bis-O-(n-butanesulfonyl)-α-dimethylglyoxime;

bissulfone derivatives such as bisnaphthylsulfonylmethane; and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of 0.1 to 50 parts by weight, and especially 0.5 to 40 parts by weight, per 100 parts by weight of the base resin (A). Less than 0.1 pbw of the acid generator may generate an insufficient amount of acid upon light exposure, resulting in a low sensitivity and resolution. More than 50 pbw of the acid generator may lower the transmittance of the resist and result in a poor resolution.

Component (D)

The basic compound (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include ammonia, primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, di-isopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable nitrogen-containing compounds having sulfonyl group include 3-pyridinesulfonic acid and pyridinium p-toluenesulfonate.

Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

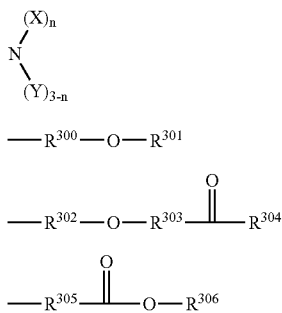

(B)-1

(X)-1

(X)-2

(X)-3

In the formulas, n is 1, 2 or 3. The side chain X may be the same or different and is represented by the formula (X)-1, (X)-2 or (X)-3. The side chain Y may be the same or different and stands for hydrogen or a straight, branched or cyclic alkyl group of 1 to 20 carbon atoms which may contain an ether or hydroxyl group. Two or three X's may bond together to form a ring. $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain at least one hydroxyl group, ether group, ester group or lactone ring; $R^{303}$ is a single bond or a straight or branched alkylene group of 1 to 4 carbon atoms; and $R^{306}$ is hydrogen or a straight, branched or cyclic alkyl group of 1 to 20 carbon atoms, which may contain at least one hydroxyl group, ether group, ester group or lactone ring.

Illustrative, non-limiting examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of basic compounds of cyclic structure having the following general formula (B)-2.

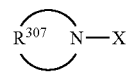

(B)-2

Herein X is a substituent group of (X)-1 to (X)-3, shown above, and $R^{307}$ is a straight or branched $C_2$-$C_{20}$ alkylene group which may contain one or more carbonyl, ether, ester or sulfide groups.

Illustrative examples of the compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate; methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-containing basic compounds having the following general formulae (B)-3 to (B)-6 may be blended.

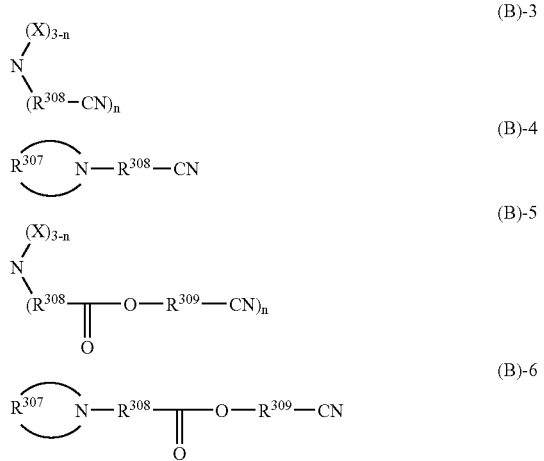

Herein, X is a substituent group of (X)-1 to (X)-3, shown above, $R^{301}$ is as defined above, n is 1, 2 or 3, and $R^{308}$ and $R^{309}$ each are independently a straight or branched alkylene group of 1 to 4 carbon atoms.

Illustrative examples of the basic compounds having cyano group as represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-(2-(methoxymethoxy)ethyl)aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are basic compounds having an imidazole skeleton and a polar functional group, represented by the general formula (B)-7.

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are basic compounds having a benzimidazole skeleton and a polar functional group, represented by the general formula (B)-8.

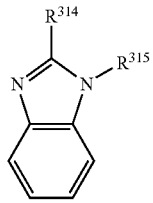

(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic alkyl group of 1 to 20 carbon atoms, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

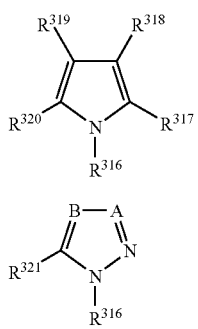

(B)-9

(B)-10

Herein, A is a nitrogen atom or ≡C—$R^{322}$, B is a nitrogen atom or ≡C—$R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring with the carbon atoms to which they are attached; $R^{321}$ is a hydrogen atom, or a straight, branched or cyclic alkyl group or aryl group having 1 to 10 carbon atoms; $R^{322}$ and $R^{323}$ each are a hydrogen atom, or a straight, branched or cyclic alkyl group or aryl group having 1 to 10 carbon atoms, or a pair of $R^{321}$ and $R^{323}$, taken together, may form a benzene or naphthalene ring with the carbon atoms to which they are attached.

The basic compounds or heterocyclic nitrogen-containing compounds may be used alone or in admixture of two or more. The basic compound (D) is preferably formulated in an amount of 0.001 to 2 parts, and especially 0.01 to 1 part by weight, per 100 parts by weight of the base resin (A). Less than 0.001 part of the basic compound may achieve no or little addition effect whereas more than 2 parts may result in too low a sensitivity.

Component (E)

The dissolution inhibitor (E) is a compound with a weight average molecular weight of up to 3,000 which changes its solubility in an alkaline developer under the action of an acid, and typically selected from phenol and carboxylic acid derivatives in which some or all of hydroxyl groups are substituted with acid labile groups (as described above) and which have a weight average molecular weight of up to 2,500.

Examples of the phenol or carboxylic acid derivative having a weight average molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl)valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol.

The acid labile groups are the same as formulae (AL-1) to (AL-3) described above.

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2''-tetrahydropyranyloxy))propane, 2,2-bis(4'-(2''-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1''-ethoxyethoxy)phenyl)propane, 2,2-bis(4'-(1''-ethoxypropyloxy)phenyl)propane, tert-butyl 4,4-bis(4'-(2''-tetrahydropyranyloxy)phenyl)valerate, tert-butyl 4,4-bis(4'-(2''-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1''-ethoxyethoxy)phenyl)valerate, tert-butyl 4,4-bis(4'-(1''-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2''-tetrahydropyranyloxy)phenyl)ethane, 1,1,2-tris(4'-(2''-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'- ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition of the invention, an appropriate amount of the dissolution inhibitor (E) is up to about 20 parts, and especially up to about 15 parts by weight per 100 parts by weight of the base resin (A). More than 20 parts of the dissolution inhibitor leads to resist compositions having poor heat resistance due to increased monomer contents.

In addition to the foregoing components, the resist composition of the invention may include optional ingredients, typically a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Fluorad FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Fluorad FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5 wt %, and preferably 2 to 3 wt %, tetramethylammonium hydroxide (TMAH), this being done by a conventional technique such as dip, puddle, or spray technique for a period of 10 seconds to 3 minutes, and preferably 30 seconds to 2 minutes. These steps result in the formation of the desired pattern on the substrate.

In forming a pattern using the resist composition of the invention, another approach known as immersion lithography may be employed involving applying the resist composition by the same procedure as described above, feeding a liquid between the wafer and a projection lens, and exposing the resist coating to high-energy radiation through a mask. The liquid fill between the wafer and the projection lens should have a high refractive index and high transparency. In the ArF immersion lithography, water having a refractive index of 1.44 at wavelength 193 nm is often used. It is expected that the higher the refractive index of liquid, the better becomes the resolution. It is thus recommended to use liquids having a refractive index of 1.6 or higher such as phosphoric acid, ethylene glycol and trialkoxyaluminum.

Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), KrAr excimer laser (134 nm), F$_2$ laser (157 nm), Kr$_2$ laser (146 nm) or Ar$_2$ laser (126 nm), x-rays, or an electron beam. The desired pattern may not be obtainable outside the upper and lower limits of the above range.

EXAMPLE

Examples of the invention are given below by way of illustration and not by way of limitation. The abbreviations used herein are NMR for nuclear magnetic resonance, Mw for weight average molecular weight, and Mn for number average molecular weight. Mw and Mn are determined by gel permeation chromatography (GPC) using polystyrene standards.

Polymer Synthesis Example 1

Copolymerization of Monomers 1, 2, 3 and 4
(45/15/10/30)

A 100-mL flask was charged with 6.25 g of Monomer 1, 5.88 g of Monomer 2, 2.05 g of Monomer 3, 5.82 g of Monomer 4, and 5.0 g of toluene. The system was purged of oxygen, after which 0.23 g of AIBN was added to the mixture in a nitrogen atmosphere. The contents were stirred at 60° C. for 24 hours. The reaction mixture was cooled down to room temperature and admitted into 400 g of n-hexane whereupon a polymer precipitated. The polymer was washed with n-hexane, isolated and dried in vacuo at 40° C. for 20 hours. There was obtained 12.2 g of a white polymer, designated Polymer 1, which had a Mw of 8,300 and a dispersity (Mw/Mn) of 1.5 as determined by GPC.

From an integration ratio of its $^1$H-NMR spectrum, Polymer 1 was found to have a copolymer composition ratio (molar ratio) of 45.4:14.6:10.1:29.9.

Monomers 1, 2, 3 and 4 are shown below.

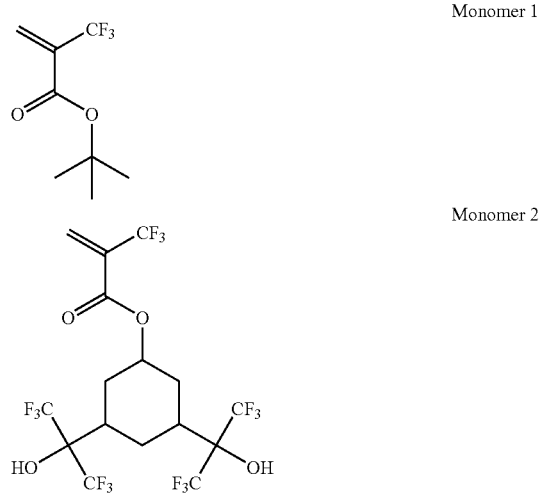

-continued

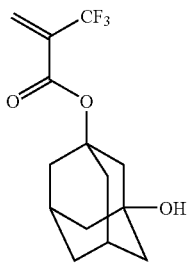

Monomer 3

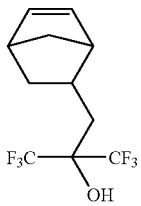

Monomer 4

Polymer Synthesis Example 2

Copolymerization of Monomers 5, 2, 3 and 4 (45/15/10/30)

A 100-mL flask was charged with 6.79 g of Monomer 5, 5.65 g of Monomer 2, 1.97 g of Monomer 3, 5.59 g of Monomer 4, and 5.0 g of toluene. The system was purged of oxygen, after which 0.22 g of AIBN was added to the mixture in a nitrogen atmosphere. The contents were stirred at 60° C. for 24 hours. The reaction mixture was cooled down to room temperature and admitted into 400 g of n-hexane whereupon a polymer precipitated. The polymer was washed with n-hexane, isolated and dried in vacuo at 40° C. for 20 hours. There was obtained 13.2 g of a white polymer, designated Polymer 2, which had a Mw of 8,500 and a dispersity (Mw/Mn) of 1.5 as determined by GPC.

From an integration ratio of its $^1$H-NMR spectrum, Polymer 2 was found to have a copolymer composition ratio (molar ratio) of 45.0:15.0:9.8:30.2.

Monomer 5 is shown below.

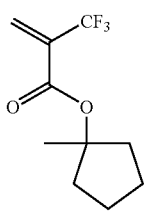

Monomer 5

Polymer Synthesis Example 3

Copolymerization of Monomers 6, 2, 3 and 4 (45/15/10/30)

A 100-mL flask was charged with 7.07 g of Monomer 6, 5.53 g of Monomer 2, 1.93 g of Monomer 3, 5.47 g of Monomer 4, and 5.0 g of toluene. The system was purged of oxygen, after which 0.22 g of AIBN was added to the mixture in a nitrogen atmosphere. The contents were stirred at 60° C. for 24 hours. The reaction mixture was cooled down to room temperature and admitted into 400 g of n-hexane whereupon a polymer precipitated. The polymer was washed with n-hexane, isolated and dried in vacuo at 40° C. for 20 hours. There was obtained 13.9 g of a white polymer, designated Polymer 3, which had a Mw of 8,100 and a dispersity (Mw/Mn) of 1.5 as determined by GPC.

From an integration ratio of its $^1$H-NMR spectrum, Polymer 3 was found to have a copolymer composition ratio (molar ratio) of 44.8:15.2:9.8:30.2.

Monomer 6 is shown below.

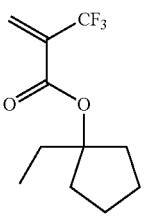

Monomer 6

Polymer Synthesis Example 4

Copolymerization of Monomers 7, 2, 3 and 4 (45/15/10/30)

A 100-mL flask was charged with 5.98 g of Monomer 7, 6.00 g of Monomer 2, 2.09 g of Monomer 3, 5.93 g of Monomer 4, and 5.0 g of toluene. The system was purged of oxygen, after which 0.24 g of AIBN was added to the mixture in a nitrogen atmosphere. The contents were stirred at 60° C. for 24 hours. The reaction mixture was cooled down to room temperature and admitted into 400 g of n-hexane whereupon a polymer precipitated. The polymer was washed with n-hexane, isolated and dried in vacuo at 40° C. for 20 hours. There was obtained 12.9 g of a white polymer, designated Polymer 4, which had a Mw of 8,300 and a dispersity (Mw/Mn) of 1.5 as determined by GPC.

From an integration ratio of its $^1$H-NMR spectrum, Polymer 4 was found to have a copolymer composition ratio (molar ratio) of 44.7:15.3:9.9:30.1.

Monomer 7 is shown below.

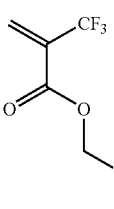

Monomer 7

Polymer Synthesis Example 5

Copolymerization of Monomers 8, 2, 3 and 4 (45/15/10/30)

A 100-mL flask was charged with 7.37 g of Monomer 8, 5.40 g of Monomer 2, 1.89 g of Monomer 3, 5.34 g of Monomer 4, and 5.0 g of toluene. The system was purged of oxygen, after which 0.21 g of AIBN was added to the mixture in a nitrogen atmosphere. The contents were stirred at 60° C. for 24 hours. The reaction mixture was cooled down to room temperature and admitted into 400 g of n-hexane whereupon a polymer precipitated. The polymer was washed with n-hexane, isolated and dried in vacuo at 40° C. for 20 hours. There was obtained 11.9 g of a white polymer, designated Polymer 5, which had a Mw of 8,500 and a dispersity (Mw/Mn) of 1.5 as determined by GPC.

From an integration ratio of its ¹H-NMR spectrum, Polymer 5 was found to have a copolymer composition ratio (molar ratio) of 44.9:15.1:9.9:30.1.

Monomer 8 is shown below.

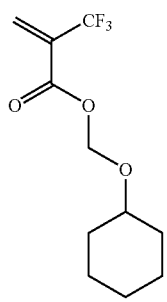

Monomer 8

Comparative Polymer Synthesis Example 1

Copolymerization of Monomers 9 and 10 (50/50)

A 100-mL flask was charged with 24.4 g of Monomer 9, 17.1 g of Monomer 10, and 40 g of tetrahydrofuran. The system was purged of oxygen, after which 0.2 g of AIBN was added to the mixture in a nitrogen atmosphere. The contents were stirred at 60° C. for 15 hours. The reaction mixture was cooled down to room temperature and admitted into 500 g of isopropyl alcohol whereupon a polymer precipitated. The polymer was washed with isopropyl alcohol, isolated and dried in vacuo at 60° C. for 20 hours. There was obtained 36.1 g of a white polymer, designated Comparative Polymer 1, which had a Mw of 12,500 and a dispersity (Mw/Mn) of 1.9 as determined by GPC.

From an integration ratio of its ¹H-NMR spectrum, Comparative Polymer 1 was found to have a copolymer composition ratio (molar ratio) of 48.0:52.0.

Monomers 9 and 10 are shown below.

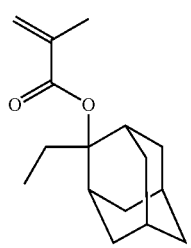

Monomer 9

-continued

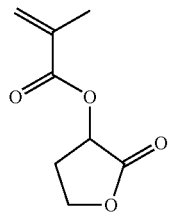

Monomer 10

Comparative Polymer Synthesis Example 2

Copolymerization of Monomers 1, 11 and 4
(45/25/30)

A 100-mL flask was charged with 7.36 g of Monomer 1, 5.79 g of Monomer 11, 6.85 g of Monomer 4, and 5.0 g of toluene. The system was purged of oxygen, after which 0.27 g of AIBN was added to the mixture in a nitrogen atmosphere. The contents were stirred at 60° C. for 24 hours. The reaction mixture was cooled down to room temperature and admitted into 400 g of n-hexane whereupon a polymer precipitated. The polymer was washed with n-hexane, isolated and dried in vacuo at 40° C. for 20 hours. There was obtained 12.9 g of a white polymer, designated Comparative Polymer 2, which had a Mw of 8,100 and a dispersity (Mw/Mn) of 1.5 as determined by GPC.

From an integration ratio of its ¹H-NMR spectrum, Comparative Polymer 2 was found to have a copolymer composition ratio (molar ratio) of 44.5:25.5:30.0.

Monomer 11 is shown below.

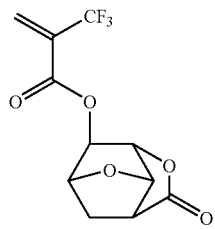

Monomer 11

Comparative Polymer Synthesis Example 3

Copolymerization of Monomers 1, 2 and 4
(45/25/30)

A 100-mL flask was charged with 5.71 g of Monomer 1, 8.97 g of Monomer 2, 5.32 g of Monomer 4, and 5.0 g of toluene. The system was purged of oxygen, after which 0.21 g of AIBN was added to the mixture in a nitrogen atmosphere. The contents were stirred at 60° C. for 24 hours. The reaction mixture was cooled down to room temperature and admitted into 400 g of n-hexane whereupon a polymer precipitated. The polymer was washed with n-hexane, isolated and dried in vacuo at 40° C. for 20 hours. There was obtained 12.2 g of a white polymer, designated Comparative Polymer 3, which had a Mw of 8,400 and a dispersity (Mw/Mn) of 1.5 as determined by GPC.

From an integration ratio of its ¹H-NMR spectrum, Comparative Polymer 3 was found to have a copolymer composition ratio (molar ratio) of 45.1:25.0:29.8.

Comparative Polymer Synthesis Example 4

Copolymerization of Monomers 1, 3 and 4 (45/25/30)

A 100-mL flask was charged with 7.26 g of Monomer 1, 5.97 g of Monomer 3, 6.77 g of Monomer 4, and 5.0 g of toluene. The system was purged of oxygen, after which 0.27 g of AIBN was added to the mixture in a nitrogen atmosphere. The contents were stirred at 60° C. for 24 hours. The reaction mixture was cooled down to room temperature and admitted into 400 g of n-hexane whereupon a polymer precipitated. The polymer was washed with n-hexane, isolated and dried in vacuo at 40° C. for 20 hours. There was obtained 12.6 g of a white polymer, designated Comparative Polymer 4, which had a Mw of 8,100 and a dispersity (Mw/Mn) of 1.5 as determined by GPC.

From an integration ratio of its ¹H-NMR spectrum, Comparative Polymer 4 was found to have a copolymer composition ratio (molar ratio) of 44.6:25.0:29.4.

Resist Preparation and Exposure

Resist solutions were prepared by mixing the polymer (Inventive Polymers 1 to 5, Comparative Polymers 1 to 4), photoacid generator (PAG1 to PAG3), basic compound (TMMEA, AAA, and AACN) and dissolution inhibitor (DRIL) in a solvent (PGMEA) in the amounts shown in Table 1 and processing in an ordinary manner.

On silicon wafers having a film of ARC-29A (Nissan Chemicals Industries, Ltd.) coated to a thickness of 78 nm, the resist solutions were spin coated, then baked on a hot plate at 120° C. for 90 seconds to give resist films having a thickness of 200 nm.

The resist films were exposed by means of an ArF excimer laser scanner model NSR-S305B (Nikon Corp., NA 0.68, σ 0.85, ⅔ annular illumination, normal mask) while varying the exposure dose. Immediately after exposure, the resist films were baked (PEB) at 110° C. for 90 seconds and then developed for 60 seconds with a 2.38 wt % aqueous solution of tetramethylammonium hydroxide, obtaining positive patterns.

The resist patterns were evaluated. The exposure dose (mJ/cm²) at which a 0.12-μm line-and-space (1:1) pattern was resolved is the optimum dose Eop. The minimum line width (nm) of a L/S (1:1) pattern which was ascertained separate at this dose Eop is the resolution. Using a measuring SEM model S-9220 (Hitachi Ltd.), the 0.12-μm L/S (1:1) pattern was measured for line edge roughness. The results are also shown in Table 1.

TABLE 1

| Polymer (pbw) | Photoacid generator (pbw) | Basic compound (pbw) | Dissolution inhibitor (pbw) | Solvent (pbw) | Sensitivity (mJ/cm²) | Resolution (nm) | Line edge roughness (nm) |
|---|---|---|---|---|---|---|---|
| Polymer 1 (100) | PAG1 (3) | TMMEA (0.4) | — | PGMEA (800) | 35 | 110 | 6.8 |
| Polymer 2 (100) | PAG1 (3) | TMMEA (0.4) | — | PGMEA (800) | 31 | 110 | 6.5 |
| Polymer 3 (100) | PAG1 (3) | TMMEA (0.2) | — | PGMEA (800) | 28 | 110 | 6.3 |
| Polymer 4 (100) | PAG1 (3) | TMMEA (0.2) | — | PGMEA (800) | 26 | 110 | 6.9 |
| Polymer 5 (100) | PAG1 (3) | TMMEA (0.2) | — | PGMEA (800) | 24 | 110 | 7.2 |
| Polymer 2 (100) | PAG2(4) PAG3(3) | THMEA (0.4) | — | PGMEA (800) | 33 | 110 | 7.6 |
| Polymer 2 (100) | PAG1 (3) | AAA (0.4) | — | PGMEA (800) | 35 | 110 | 6.5 |
| Polymer 2 (100) | PAG1 (3) | AACN (0.4) | — | PGMEA (800) | 35 | 105 | 6.6 |
| Polymer 2 (100) | PAG1 (3) | TMMEA (0.4) | DRI1 (10) | PGMEA (800) | 26 | 110 | 6.8 |
| Comparative Polymer 1 (100) | PAG1 (3) | TMMEA (0.4) | — | PGMEA (800) | 38 | 120 | 9.3 |
| Comparative Polymer 2 (100) | PAG1 (3) | TMMEA (0.4) | — | PGMEA (800) | 32 | 120 | 6.8 |
| Comparative Polymer 3 (100) | PAG1 (3) | TMMEA (0.4) | — | PGMEA (800) | 26 | 110 | 6.3 |
| Comparative Polymer 4 (100) | PAG1 (0.4) | TMMEA (0.4) | — | PGMEA (800) | — | pattern collapse | — |

TABLE 1-continued
| Polymer (pbw) | Photoacid generator (pbw) | Basic compound (pbw) | Dissolution inhibitor (pbw) | Solvent (pbw) | Sensitivity (mJ/cm$^2$) | Resolution (nm) | Line edge roughness (nm) |
|---|---|---|---|---|---|---|---|
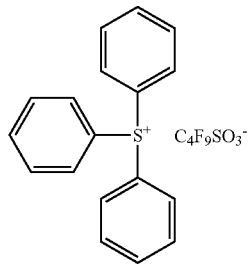
PAG1
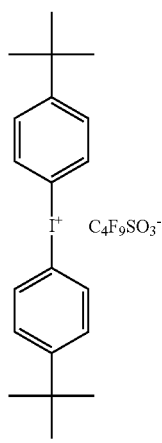
PAG2
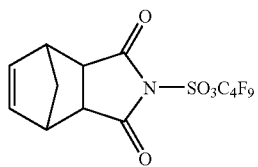
PAG3
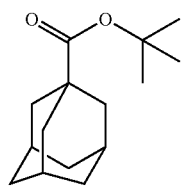
DRI1
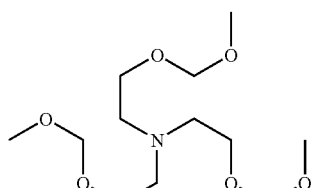
TMMEA

TABLE 1-continued

| Polymer (pbw) | Photoacid generator (pbw) | Basic compound (pbw) | Dissolution inhibitor (pbw) | Solvent (pbw) | Sensitivity (mJ/cm$^2$) | Resolution (nm) | Line edge roughness (nm) |
|---|---|---|---|---|---|---|---|

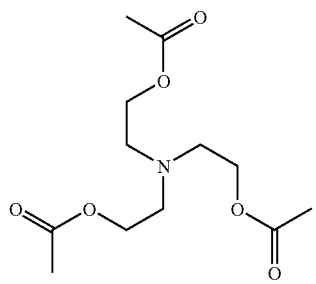

AAA

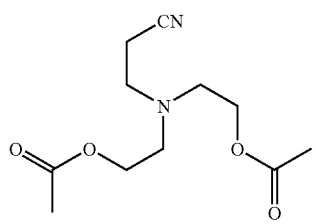

AACN

PGMEA: propylene glycol monomethyl ether acetate

Dry Etching Test

Each polymer, 2 g, was thoroughly dissolved in 10 g of PGMEA, and passed through a filter having a pore size of 0.2 μm, obtaining a polymer solution. The polymer solution was spin coated onto a silicon substrate and baked, forming a polymer film of 300 nm thick. Dry etching tests were carried out on the polymer films by etching them under two sets of conditions. In an etching test with CHF$_3$/CF$_4$ gas, a dry etching instrument TE-8500P (Tokyo Electron K.K.) was used. In an etching test with Cl$_2$/BCl$_3$ gas, a dry etching instrument L-507D-L (Nichiden Anerba K. K.) was used. In each test, the difference in polymer film thickness before and after etching was determined. The etching conditions are summarized in Table 2.

TABLE 2

|  | CHF$_3$/CF$_4$ gas | Cl$_2$/BCl$_3$ gas |
|---|---|---|
| Chamber pressure (Pa) | 40.0 | 40.0 |
| RF power (W) | 1000 | 300 |
| Gap (mm) | 9 | 9 |
| Gas flow rate (ml/min) | CHF$_3$: 30<br>CF$_4$: 30<br>Ar: 100 | Cl$_2$: 30<br>BCl$_3$: 30<br>CHF$_3$: 100<br>O$_2$: 2 |
| Time (sec) | 60 | 60 |

The results of etching tests are shown in Table 3. In this evaluation, a less difference in polymer film thickness, i.e., a less film loss indicates more etching resistance. It is seen that inventive resist compositions have etching resistance comparable to the prior art resist compositions.

TABLE 3

| Polymer | CHF$_3$/CF$_4$ gas etching rate (nm/min) | Cl$_2$/BCl$_3$ gas etching rate (nm/min) |
|---|---|---|
| Polymer 1 | 150 | 170 |
| Polymer 2 | 133 | 166 |
| Polymer 3 | 132 | 162 |
| Polymer 4 | 155 | 178 |
| Polymer 5 | 140 | 166 |
| Comparative Polymer 1 | 160 | 182 |
| Comparative Polymer 2 | 160 | 188 |
| Comparative Polymer 3 | 186 | 203 |
| Comparative Polymer 4 | 135 | 168 |

Japanese Patent Application No. 2005-028618 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units having the general formulae (1a) to (1d) and having a weight average molecular weight of 1,000 to 500,000,

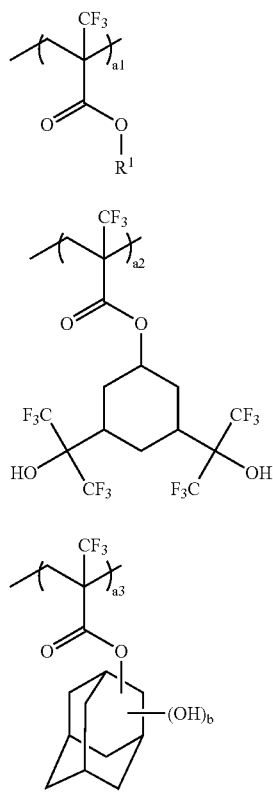

(1a)
(1b)
(1c)

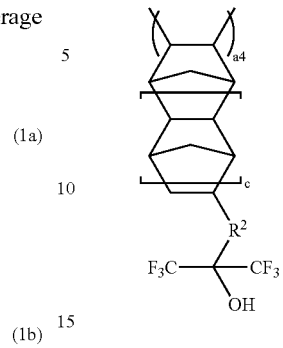

(1d)

wherein $R^1$ is an acid labile group, $R^2$ is a single bond or methylene group, a1, a2, a3, and a4 are numbers in the range: $0<a1<1$, $0<a2<1$, $0<a3<1$, $0<a4<1$, and $0<a1+a2+a3+a4\leq1$, b is 1 or 2, and c is 0 or 1.

2. A resist composition comprising the polymer of claim 1.

3. A chemically amplified positive resist composition comprising (A) the polymer of claim 1, (B) an organic solvent, and (C) a photoacid generator.

4. The resist composition of claim 3, further comprising (D) a basic compound.

5. The resist composition of claim 3, further comprising (E) a dissolution inhibitor.

6. A process for forming a pattern, comprising the steps of (1) applying the resist composition of claim 2 onto a substrate to form a coating, (2) heat treating the coating and exposing it to high-energy radiation with a wavelength of up to 200 nm through a photomask, and (3) optionally heat treating the exposed coating and developing it with a developer.

7. The process of claim 6 wherein the high-energy radiation is of an ArF excimer laser.

* * * * *